United States Patent [19]

Erman et al.

[11] Patent Number: 4,652,077
[45] Date of Patent: Mar. 24, 1987

[54] SEMICONDUCTOR DEVICE COMPRISING A LIGHT WAVE GUIDE

[75] Inventors: Marko Erman; Nakita Vodjdani, both of Paris; Jean-Bernard Theeten, Ozoir-la-Ferriere, all of France

[73] Assignee: U.S. Philips Corporation, New York, N.Y.

[21] Appl. No.: 626,272

[22] Filed: Jun. 29, 1984

[30] Foreign Application Priority Data

Jul. 1, 1983 [FR] France ................. 83 11007

[51] Int. Cl.$^4$ .................. G02B 6/10; H01L 29/04
[52] U.S. Cl. .................... 350/96.12; 357/60; 350/96.11
[58] Field of Search ........... 357/60; 350/96.11, 96.12; 372/45

[56] References Cited

U.S. PATENT DOCUMENTS

| | | | |
|---|---|---|---|
| 3,746,908 | 7/1973 | Engeler | 357/60 |
| 3,887,404 | 6/1975 | Chané | 357/60 |
| 3,900,863 | 8/1975 | Kim | 357/60 |
| 3,986,200 | 10/1976 | Allison | 357/60 |
| 4,116,530 | 9/1978 | Bellavance et al. | 350/96.12 |
| 4,359,260 | 11/1982 | Reinhart et al. | 350/96.12 |
| 4,420,873 | 12/1983 | Leonberger et al. | 350/96.12 |
| 4,518,219 | 5/1985 | Leonberger et al. | 350/96.12 |
| 4,581,742 | 4/1986 | Botez | 372/45 |
| 4,585,299 | 4/1986 | Strain | 350/96.12 |

FOREIGN PATENT DOCUMENTS

| | | | |
|---|---|---|---|
| 107354 | 8/1979 | Japan | 350/96.12 |
| 12907 | 1/1980 | Japan | 350/96.12 |

OTHER PUBLICATIONS

Chane et al., Journal of Crystal Growth, vol. 13, No. 14, 1972, "Etude de l'Epitaxie Localisee du GaAs", pp. 325-330.
Leonberger et al., Conference: Integrated and Guided-Wave Optics Technical Digest, Incline Village, N.Y., USA, 28-30, Jan. 1980, "Oxide-Confined GaAs Optical Waveguides Formed by Lateral Epitaxial Growth", WB1-1 to WB1-4.
MacFadyen et al., Electronics Letters, vol. 16, No. 11, 22 May 1980, "Waisted-Rib Optical Waveguides in GaAs", pp. 440-441.

Primary Examiner—William L. Sikes
Assistant Examiner—Frank González
Attorney, Agent, or Firm—Paul R. Miller

[57] ABSTRACT

A semiconductor device comprises a wave guide which permits propagation of light in the range of wavelengths between 0.9 and 1.6 μm. This wave guide is formed on a crystallographic oriented substrate of monocrystalline semiconductor material from the group III-V covered with a layer of a dielectric material. Grooves are etched in the dielectric material according to the configuration chosen for the wave guide, and correspondingly into the substrate. The wave guide is obtained by anisotropic epitaxial growth of the III-V semiconductor material from the substrate in these grooves, and is bounded on its lateral and upper parts by crystallographic faces having a specific orientation relative to the plane of the substrate surface. The attenuation obtained for such wave guides is of the order of 1 dB/cm for light having a wavelength of 1.06 μm.

7 Claims, 9 Drawing Figures

SEMICONDUCTOR DEVICE COMPRISING A LIGHT WAVE GUIDE

The invention relates to a semiconductor device comprising a monocrystalline semiconductor substrate covered with a dielectric layer, at least one groove extending in the dielectric layer as far as the substrate and a light wave guide in the form of a monocrystalline ribbon obtained from an epitaxial semiconductor layer formed in the groove on a crystal face of the substrate.

The invention further relates to a method of manufacturing such a wave guide.

BACKGROUND OF THE INVENTION

This invention is used on the one hand in the realization of the coupling between conventional optical fibers and integrated circuits for detection or emission of radiation, and on the other hand in the field of optical connections in micro-opto-electronics.

Such a device is known from the publication of F. J. Leonberger et al. in Applied Physics Letters 38 (5) of March 1, 1981, pages 313–315, entitled "Low loss GaAs optical wave guides formed by lateral epitaxial growth over oxide". This document discloses a method of manufacturing wave guides on a monocrystalline substrate of gallium arsenide covered with a layer of silicon oxide ($SiO_2$). Windows are opened in this layer by etching, and an $n^+$ doped monocrystalline gallium arsenide layer is formed in these windows by epitaxial growth. At the beginning of the growing process, the layer of $n^+$ GaAs is formed from the starting material constituted by the substrate exposed in the opening of the windows, after which, when the epitaxial layer thickens, it reaches the sides of the windows and finally forms above the whole layer of $SiO_2$ a uniform layer of monocrystalline $n^+$ doped GaAs. After this layer of GaAs has been formed, the wave guides are formed by etching this layer. These wave guides have the form of a ribbon of rectangular section. Due to the underlying layer of silicon oxide the losses along a guide of this type are rather low and the attenuation along such a wave guide is of the order of 2.3 dB/cm at a wavelength of 1.06 $\mu$m.

However, the light propagated in such a guide is poorly confined by the lateral walls. In fact, since these guides are etched in the layer of gallium arsenide not as deep as the layer of silica ($SiO_2$), they do not exhibit interfaces between air and gallium arsenide (GaAs) over the whole height of the lateral vertical surfaces, but only over part thereof. Now, if the interface between air and gallium arsenide (GaAs) permits on the upper surface of the guide of obtaining a very high total reflection due to the difference in refractive index between air and gallium arsenide (GaAs) of $\Delta n \simeq 2.5$, on the contrary, the fact that there is no interface between the guide and the continuous layer of gallium arsenide (GaAs), involves losses along the longitudinal walls of the guide. On the other hand, the lateral and upper walls obtained by the chemical etching treatment have a rough surface. This surface state also gives rise to losses.

These losses are even more strongly pronounced when the guide should be given a radius of curvature to incurve the path of the light.

For the envisaged applications, the technical problem arising is to provide a device so that both ultrahigh speed integrated circuits can be realized and the light can be propagated with a low attenuation. Investigations have shown that the ideal attenuation must not exceed 1 dB/cm for a wavelength of 1.06 $\mu$m.

The device proposed in the aforementioned publication, which has an attenuation of 2.3 dB/cm in this wavelength range, cannot be utilized to form wave guides of great length. Moreover, since the light is poorly confined along the longitudinal walls, this device cannot be utilized to form wave guides having small radii of curvature.

SUMMARY OF THE PRESENT INVENTION

This is why the present invention has for its object to provide a novel semiconductor device of the kind defined in the preamble, characterized in that the lateral and upper surfaces of the waveguide are crystallographic faces having a specific orientation with respect to the substrate plane.

Thus, in order to realize wave guides according to the present invention, attempts are especially made to obtain an anisotropic growth which is utilized to obtain directly the form desired for the wave guide. In these conditions, no supplementary etching operation of the epitaxial layer need be carried out.

According to a variation of the present invention, this device is characterized in that the groove in the dielectric layer is prolonged by a groove in the monocrystalline substrate and in that the wave guide is formed starting from this second groove.

According to a second variation of the present invention, the device is characterized in that the groove in the substrate is under-etched under the dielectric layer, in that a second dielectric layer covers the bottom of the second under-etched groove, but not the crystalline facets forming the walls of this groove, and in that the wave guide is formed from these walls.

These different devices are provided with wave guides which have analogous physical properties. However, the manufacture of the device of the third type comprises a supplementary step in which the second silicon oxide layer is deposited. However, due to the presence of the latter layer, the light is better confined in the wave guide and the losses are a minimum.

A reduction of the influence of the bottom of the groove or of the roughness of the lateral and upper surfaces can be obtained by another variation of this device, characterized in that the substrate is of the n-type, in that an n-type epitaxial layer more highly doped than the substrate covers the lateral surfaces and the bottom of the second groove, in that on this layer the wave guide is formed which comprises an epitaxial more weakly doped n-type layer, and in that the wave guide comprises a stratified structure of n-type epitaxial layers which are alternately highly and weakly doped.

For the envisaged application of the coupling of optical fibers to integrated circuits, the monocrystalline orientated semiconductor substrate and the epitaxial layer are constituted by semiconductor $A_{III} B_V$ compounds and more particularly by gallium arsenide, which material is favorable for the manufacture of ultrahigh speed integrated circuits. The protective dielectric layer may consist, for example, of silicon dioxide ($SiO_2$) or of silicon nitride ($Si_3N_4$).

On the other hand, such light wave guides have on their longitudinal part and on their upper part planar crystallographic facets, which, in view of the refractive index difference $\Delta n \simeq 2.5$ between air and gallium arsenide, permit of obtaining a quasi perfect total reflection of the light rays. This results in that the attenuation can reach the ideal value of 1 dB/cm for the wavelength of 1.6 μm.

Such an epitaxial growth from orientated monocrystalline GaAs has been described in the publications (Journal of Crystal Growth B/14 (1972) 325-330). However, the crystals obtained had small dimensions and no industrial application had been envisaged.

Therefore, the present invention moreover has for its object to provide a method of manufacturing, in which the obtained crystals have controlled dimensions and a controlled form which are perfectly reproducible. This method comprises the steps of depositing on a crystalline surface of a monocrystalline orientated semiconductor substrate a dielectric layer, forming by etching the dielectric layer at least one groove extending down to the substrate, growing an epitaxial layer in the groove on the substrate and forming a light wave guide in the epitaxial layer, and is characterized in that the epitaxial growth produces a crystallized ribbon growing vertically in an anisotropic manner above the groove and having for its lateral and upper surfaces crystallographic faces which have a specific orientation with respect to the substrate plane with this ribbon of crystallized material constituting the wave guide.

A variation of this method is proposed, which is characterized in that the step of etching the groove in the dielectric layer is prolonged by a step of anisotropically etching the monocrystalline orientated substrate, thus obtaining an under-etched groove in the substrate, in that then a second layer of a dielectric material is deposited on this assembly and covers the bottom of the under-etched groove, but not the edges which are situated under the overhanging first dielectric layer, and in that finally the wave guide is obtained by anisotropic growth from the crystalline facets constituting the walls of the under-etched groove.

Another variation of this method is characterized in that the monocrystalline orientated semiconductor substrate is of the n-type, in that an n-type epitaxial layer more highly doped than the substrate is formed on the lateral surfaces and the bottom of the groove, and in that finally the wave guide is formed in the groove thus obtained by epitaxial growth of a semiconductor material of the n-type more weakly doped than the preceding layer.

Moreover, according to another variation, this method can be characterized in that at the upper surface of the wave guide there are formed alternately epitaxial layers of n-type highly doped semiconductor material and epitaxial layers of n-type weakly doped semiconductor material. Finally, the substrate and the epitaxial layer(s) can be made of a monocrystalline orientated $A_{III}B_V$ semiconductor compound and the dielectric layer can be made of $SiO_2$ or of $Si_3N_4$.

BRIEF DESCRIPTION OF THE DRAWINGS

In order that the invention may be readily carried into effect, it will now be described more fully with reference to the accompanying drawings, in which.

DESCRIPTION OF THE PREFERRED EMBODIMENTS

Figure 1A:
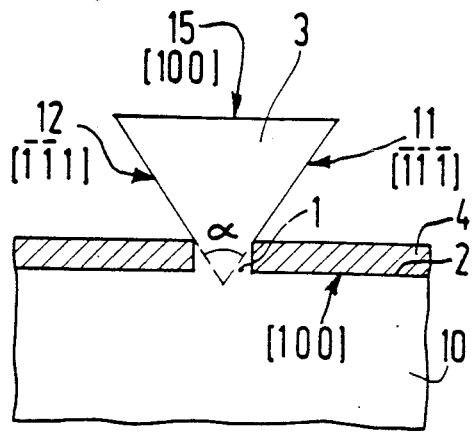
FIGS. 1a and 1b are sectional views of a wave guide made of gallium arsenide obtained after etching the amorphous layer by growth on the plane (1 0 0) of the substrate and parallel to the direction [1,1,0] of this plane.

In an embodiment of the invention as shown in FIGS. 1 to 3 inclusive, the substrate 10 of monocrystalline GaAs having an orientation along a (1,0,0) surface of the crystallographic lattice is subjected to a mechanochemical polishing treatment and is then etched. A layer 4 of $SiO_2$ having a thickness of 100 nm is then deposited on the surface 2 by pyrolysis of $SiH_4$ in an oxygen atmosphere, and is then etched down to the substrate in such a manner that a groove 1 is obtained. The geometry of the groove 1 follows the configuration provided for the light wave guide and typically has a width of 1 μm. The growth of the wave guide 3 in the groove is obtained by the so-called chloride method from the substrate 10 used as starting material. The mode of operation is derived from that used in conventional epitaxial growing. An etching step systematically precedes the growth.

Different orientations of the basic plane 2 of the substrate 10 of GaAs are possible and permit an anisotropic crystalline growth of the kind mentioned above. The plane (1 0 0) is chosen so as to yield the most satisfactory results.

It should be noted that the form of wave guide obtained depends upon the orientation of the groove in the plane (1,0,0). FIGS. 1 to 3 clearly illustrate this phenomenon. In the crystallographic direction to which the groove is parallel, the growth produces wave guides of different shape having facets characteristic of the direction of growth. The different morphology of the growth figures results from the influence of the polarity of the plane on the rates of growth.

Figure 1B:
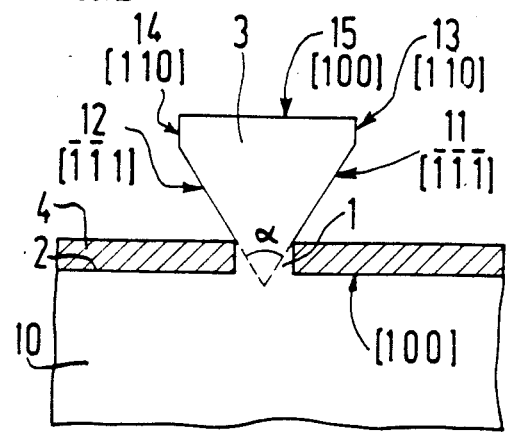

In FIGS. 1a and 1b, in which the groove 1 is parallel to the direction [1,1,0], the wave guide 3 is limited by the surfaces ($\bar{1}11$) and ($\bar{1}\bar{1}1$) designated by reference numerals 11 and 12 which enclose with each other an angle α of 70° 53', as well as possibly by the vertical surfaces (1 1 0) designated by reference numerals 13 and 14, and finally by an upper horizontal surface (1 0 0) parallel to the basic plane 2 and designated by reference numeral 15. The general form of the righthand section of the guide is an isosceles triangle, the top of which is turned downwards.

Figure 2A:
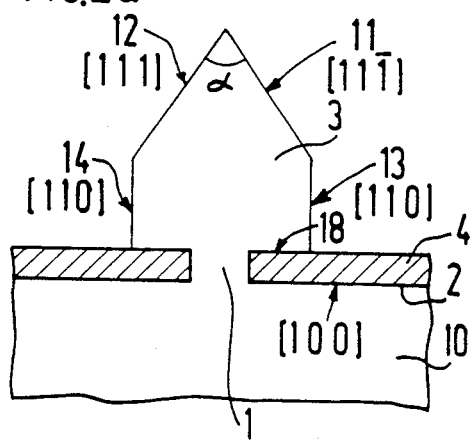
FIGS. 2a and 2b are sectional views in the conditions of FIG. 1 of a guide parallel to the direction [1,1,0]
Figure 2B:
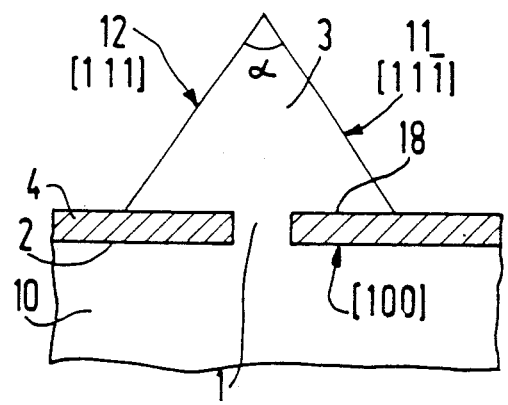

In FIGS. 2a and 2b, in which the groove 1 is parallel to the direction [1,1,0], the wave guide is bounded by the vertical surfaces (1 1 0) designated by reference numerals 13 and 14 and by the surfaces (1 1 $\bar{1}$) and (1 1 1) designated by reference numerals 11 and 12 which enclose with each other an angle α of 70° 53', and finally by the lower horizontal surface (1 0 0) denoted by reference numeral 18. The general form of the righthand section of the guide is an isosceles triangle, the top of which is directed upwards.

Figure 3A:
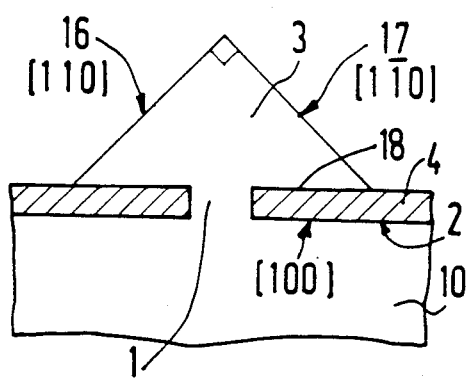
FIGS. 3a and 3b show in the same conditions a guide orientated parallel to the direction [1,0,0]
Figure 3B:
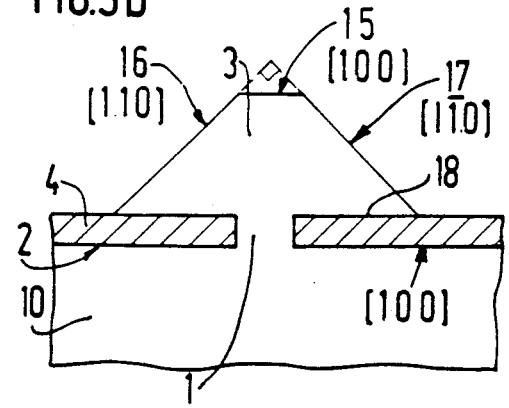

In FIGS. 3a and 3b, in which the groove is orientated parallel to the direction [1,0,0], the wave guide is bounded by the surfaces (1 1 0) and (1 $\bar{1}$ 0) designated by reference numerals 16 and 17, which are perpendicular to each other, and possibly by an upper horizontal surface (1 0 0) designated by reference numeral 15. The general form of the wave guide is a rectangular isosceles triangle, the top of which is directed upwards.

Figure 4:
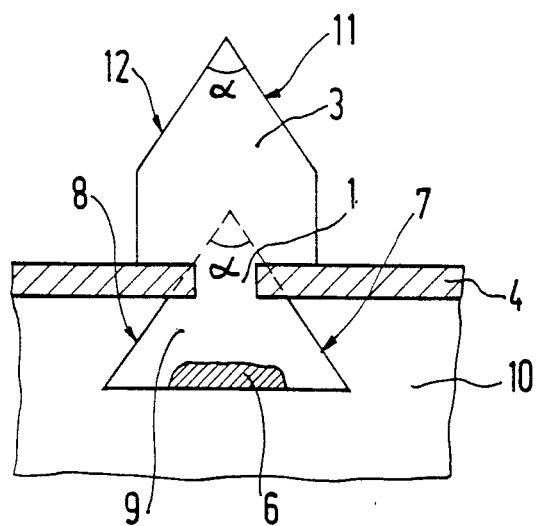
FIG. 4 is a sectional view of a wave guide formed using under-etching and deposition of an amorphous layer on the bottom of the groove.

FIG. 4 shows the righthand section of a wave guide formed using an under-etching. The first layer 4 of silica (SiO$_2$) is deposited from the vapor phase and is then etched. The etching step is prolonged in the substrate. Thus, an under-etched groove 9 is obtained, whose walls 7 and 8 and whose bottom are crystalline facets due to the fact that the substrate 10 is monocrystalline and orientated. The second layer 6 of SiO$_2$ is obtained by evaporation in vacuo. The facets of the edges 7 and 8 of the under-etched groove 9 guide the beginning of the anisotropic crystallization, as a result of which the wave guide 3 can be manufactured. The ultimate form of the latter depends upon these facets 7 and 8 and consequently also upon the crystallographic direction to which the groove is parallel.

Figure 5:
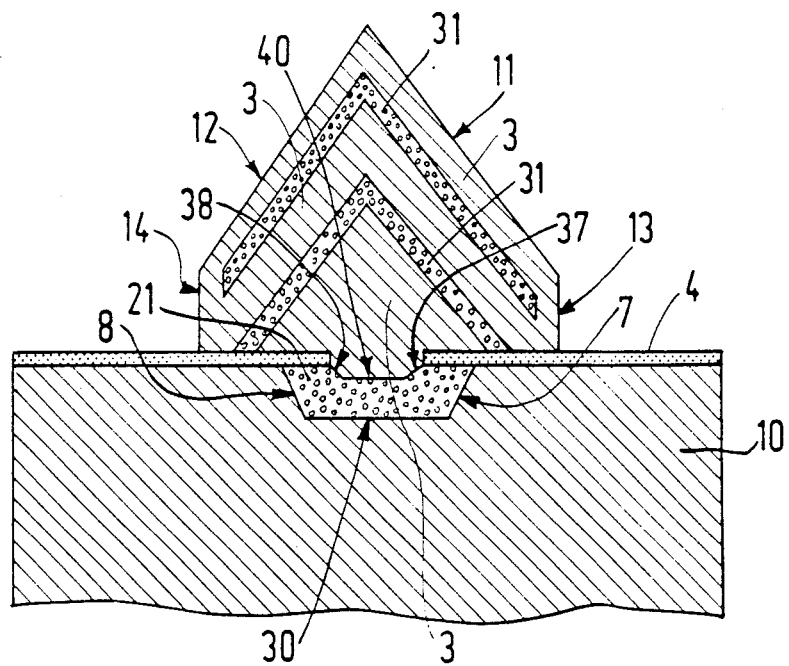
FIG. 5 shows diagrammatically in sectional view a guide parallel to the direction [1,1,0] formed using under-etching in an n-type substrate.

FIG. 5 shows diagrammatically in sectional view a wave guide obtained from a monocrystalline semiconductor n-type substrate 10 orientated in the direction (1 0 0) which is covered with a dielectric layer 4 of silicon nitride (Si$_3$N$_4$). The under-etched groove has the facets 7 and 8 (1 1 1) and (1 1 $\bar{1}$), respectively, characteristic of its orientation parallel to the direction [1,1,0] and the bottom (1 0 0). An epitaxial layer 21 of n$^+$ GaAs is formed on the bottom and the lateral surfaces of this groove. Subsequently, the wave guide is formed by epitaxial growth of n-GaAs from the surfaces 37 and 38 and from the bottom 40 of the preceding layer. The wave guide can further be covered with one or several epitaxial layers 31 of n$^+$ GaAs alternating with epitaxial layers of n$^-$ GaAs.

In all the cases described above, the path of the light rays extends mainly in the part 3 of the wave guide erected above the SiO$_2$ layer 4. The light rays "see" little of the upper surface 2 of the GaAs substrate 10 of the bottom of groove 1, taking into account the surface dimensions. In the case of the under-etched groove shown in FIG. 4, instead of the bottom of groove 1, the rays "see" the layer 6 of SiO$_2$ and not the edges 7 and 8. Consequently, they are subjected to a total reflection and therefore the losses are slightly further reduced without the technology becoming much more complex. In the case of wave guides obtained by modulation of the doping shown in FIG. 5, the refractive index differences between the GaAs of the type n$^-$ and the GaAs of the type n$^+$ permit confining the light in the GaAs of the type n$^-$. In such wave guides, an intrinsic loss of 1.5 dB/cm has been measured.

In a variation of the wave guide as shown in FIG. 5, the under-etched groove may be given large dimensions. If the substrate is semi-insulating, an n$^+$ confinement layer is formed, after which the wave guide is formed by epitaxial growth of n$^-$ GaAs from the surfaces 37,38 and from the bottom 40. The growth is stopped when the wave guide reaches the dielectric layer. The opening 1 can then be closed by superimposing alternately epitaxial layers of GaAs-n$^+$ and of GaAs-n$^-$. On the contrary, if the substrate is doped n$^+$, the wave guide can be formed directly in the groove by growth of GaAs doped n$^-$. The process can then be terminated in the manner described above. In a general manner, in order to obtain a satisfactory confinement of the light, the confinement layers must be doped n$^+$, while the guide must be doped n$^-$. In such an embodiment, the wave guide is consequently confined entirely in the substrate.

In these conditions of minimum losses and of very satisfactorily confined light, the light wave guides thus obtained can be chosen to have paths which are long and at the same time have pronounced radii of curvature.

Figure 6:
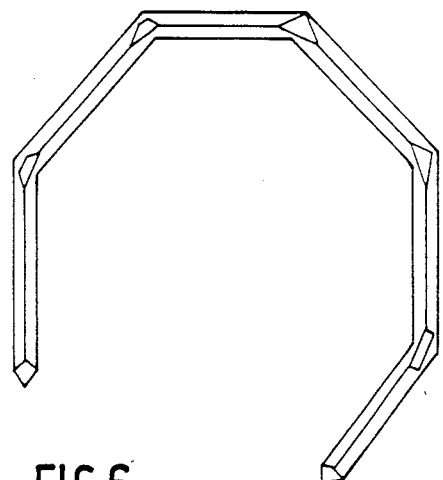
FIG. 6 is a plan view of a wave guide, whose path is curved.

By way of example, FIG. 6 shows in plan view a wave guide having a radius of curvature. The growth of such a guide is permitted by the initial formation of several groove parts having different crystallographic orientations, formed one after the other along the course of a broken line.

The excellent performances of such wave guides and the flexibility of the possibilities of technological realization permit of providing for these devices a wide range of applications, more particularly when the substrate is chosen to consist of gallium arsenide. In fact, this material permits of manufacturing ultrahigh-speed integrated circuits. The opto-electronic circuits integrated monolithically on gallium arsenide consequently permit attaining very high speeds.

Some applications already realized can be mentioned by way of example.

Firstly, the conventional coupling of optical fibers to electroluminescent diodes formed on a substrate of gallium arsenide together with wave guides according to the invention.

Subsequently, the modulation of the light transported through such guides with this modulation being obtained by means of circuits formed on the same substrate.

In these examples of application, the wavelengths normally range between 0.9 $\mu$m and 1.6 $\mu$m, the window of transparency lying typically between 1.3 and 1.55 $\mu$m.

It should be noted that the epitaxial growth from the monocrystalline orientated substrate, used as starting material, can be effected not only by using the same material as the substrate, but also by using another semiconductor material, whose crystallographic lattice parameters are compatible with the lattice parameters of the substrate.

It should further be noted that during the manufacture of a wave guide according to any of the methods in accordance with the invention, facets forming a prism are formed at the end of the guide, and that the prism can be realized in order to obtain by total reflection the introduction or the extraction of light in the wave guide through the rear surface of the substrate.

It is clear to those skilled in the art that numerous variations of this method with the use of different crystalline materials can be carried out without departing from the scope of the invention.

What is claimed is:

1. A semiconductor device comprising
   a monocrystalline substrate having a surface,
   a dielectric layer covering said substrate surface,
   at least one groove extending longitudinally in said dielectric layer, said groove extending downwardly to said substrate surface,
   a second groove extending downwardly into said substrate from said at least one groove, and
   a light wave guide of a monocrystalline ribbon of epitaxial semiconductor material, said wave guide starting in said second groove, extending through said at least one groove, and extending above said dielectric layer, and said wave guide having lateral and upper surfaces being crystallographic faces with a specific orientation to the crystallographic faces with a specific orientation to the crystallographic plane of said substrate surface.

2. A semiconductor device according to claim 1, wherein said second groove is underetched under said dielectric layer with walls having crystalline facets, wherein a second dielectric layer covers the bottom of said second groove but is free of said walls, and wherein said wave guide starts from said walls.

3. A semiconductor device according to claim 1, wherein said substrate is n-type, and wherein an n-type epitaxial layer covers the bottom and walls of said second groove, said epitaxial layer being more highly doped than said substrate, and said wave guide being formed on said epitaxial layer of a more weakly doped epitaxial n-type material than said epitaxial layer.

4. A semiconductor device according to claim 1 or claim 2 or claim 3, wherein said wave guide comprises a stratified structure of alternate highly and weakly doped n-type epitaxial layers and material.

5. A semiconductor device according to claim 1 or claim 2 or claim 3, wherein said dielectric layer is one of silicon oxide or silicon nitride.

6. A semiconductor device according to claim 1 or claim 2 or claim 3, wherein said substrate surface is oriented along the (100) face of said monocrystalline crystal lattice.

7. A semiconductor device according to claim 1 claim 2 or claim 3, wherein said wave guide propagates light at a wavelength in the range between 0.9 and 1.6 $\mu$m.

* * * * *

UNITED STATES PATENT AND TRADEMARK OFFICE
CERTIFICATE OF CORRECTION

PATENT NO. : 4,652,077
DATED : March 24, 1987
INVENTOR(S) : Marko Erman et al

It is certified that error appears in the above-identified patent and that said Letters Patent is hereby corrected as shown below:

IN THE CLAIMS

Claim 1, line 16    delete "faces with a specific orientation to the crystallo-"

line 17    delete "graphic"

Signed and Sealed this

Seventh Day of February, 1989

*Attest:*

DONALD J. QUIGG

*Attesting Officer*     *Commissioner of Patents and Trademarks*